(12) United States Patent
Griffin et al.

(10) Patent No.: US 6,420,888 B1
(45) Date of Patent: Jul. 16, 2002

(54) TEST SYSTEM AND ASSOCIATED INTERFACE MODULE

(75) Inventors: Gary W. Griffin; Myngoc T. Nguyen, both of San Jose; Gary A. Wells, Fremont; Carl R. Gore, San Jose; John W. Joy, Paradise; Chris A. Shmatovich, Oroville, all of CA (US)

(73) Assignee: Schlumberger Technologies, Inc., San Jose, CA (US)

( * ) Notice: Subject to any disclaimer, the term of this patent is extended or adjusted under 35 U.S.C. 154(b) by 50 days.

(21) Appl. No.: 09/676,144

(22) Filed: Sep. 29, 2000

(51) Int. Cl.$^7$ .............................................. G01R 31/02
(52) U.S. Cl. .................. 324/754; 324/158.1; 324/758; 439/141; 439/331; 438/14; 438/18
(58) Field of Search .................. 324/765, 754, 324/158.1, 758, 761; 439/141, 331; 438/14, 18

(56) References Cited

U.S. PATENT DOCUMENTS

| | | | | |
|---|---|---|---|---|
| 5,422,574 A | * | 6/1995 | Kister .......................... | 324/754 |
| 5,642,054 A | * | 6/1997 | Pasiecznik, Jr. ............ | 324/754 |
| 6,104,202 A | * | 8/2000 | Slocum et al. .............. | 324/758 |
| 6,166,553 A | * | 12/2000 | Sinsheimer .................. | 324/754 |

OTHER PUBLICATIONS

"IDS 10000$_{cs}$ Automated e–beam wafer probe for characterization," product description, Schlumberger (1999), 2 pgs.

"IDS 10000 ProbeSystem," product description, Schlumberger Technologies (1994), 4 pgs.

"IDS 2000™, Flip–chip Probe System," product description, Schlumberger (1999), 2 pgs.

"IDS P3Xa™, High resolution imaging, innovative design, critical precision for micro–probing," product description, Schlumberger (2000), 2 pgs.

"RDX2200™, The Highest accuracy RDRAM Production System," product description, Schlumberger (1999), 2 pgs.

"768 Pin Load Module,"data sheet, Schlumberger (1998), 2 pgs.

* cited by examiner

Primary Examiner—Michael J. Sherry
Assistant Examiner—Jimmy Nguyen
(74) Attorney, Agent, or Firm—Skjerven Morrill LLP; Ronald J. Meetin

(57) ABSTRACT

A module (44) for a test system interfaces between (a) a tester mechanism (16 and 42) having tester contacts (152) for carrying test signals and (b) a device-side board (46) having device-side contacts (162) for connection to external leads of an electronic device (40) under test. The interface module contains a tester side body (50) having tester side openings (86) for being positioned opposite the tester-side contacts, a device-side body (52) having device-side openings (136) for being positioned opposite the device-side openings, and interface conductors (54) extending through the tester-side and device-side openings for connecting the tester contacts to the device-side contacts. The tester body is configured, typically as at least five wedge-shaped portions (68), in such a manner as to enable the electronic device under test to have an increased number of external leads.

24 Claims, 11 Drawing Sheets

TEST SYSTEM AND ASSOCIATED INTERFACE MODULE

FIELD OF USE

This invention relates to test equipment, especially automated test equipment for testing and examining electronic devices such as integrated circuits.

BACKGROUND ART

Integrated circuits ("ICs") can be tested or/and examined in various ways. One testing/examining (diagnostic) technique is to electrically stimulate an IC and then monitor its electrical response, typically by comparing the actual response to a reference response. The stimulation/response-monitoring technique is commonly performed with automated test equipment connected to the external electrical leads, commonly referred to as pins, by which the IC interacts with the outside world. The test equipment stimulates the IC by providing electrical signals to the IC's pins and then monitoring the resultant electrical signals provided from the IC on its pins.

Another diagnostic technique involves probing an IC, especially when the IC has failed and it is desirable to determine the reason(s) for failure. The probing technique can be done in an intrusive manner by physically contacting the IC with a probe. The probing technique can also be done in a largely non-intrusive manner by directing radiation such as light, electrons, or ions toward parts of the IC. The test equipment which performs the stimulation/response-monitoring technique often includes a probing capability.

FIG. 1 illustrates an example of a conventional test system that combines a stimulation/response-monitoring technique with a non-intrusive electron-beam probing capability for testing/examining an integrated circuit 10 referred to generally as a device under test ("DUT"). The test system in FIG. 1 consists of core automated test equipment 12, manipulator 14, test head 16, tester load board 18, interface module 20, device-side board (or card) 22, and device chamber 24 which contains an electron-beam probe (not separately shown). DUT 10 is situated in device chamber 24 and attached to device-side board 22 also situated in chamber 24.

An example of a test system containing automated test equipment 12, manipulator 14, and test head 16 is the Schlumberger ITS 9000® automated test system. An example of an electron-beam probe system containing device chamber 12 is the Schlumberger 10000® probe system. Module 20 interfaces between the probe and test systems. Inasmuch as electron-beam probing needs to be done in a high vacuum, interface module 20 is configured to be airtight along device-side board 22.

Interface module 20 consists of tester-side body 26, device-side body 28, and electrical interface conductors 30 which pass through openings (not shown here) in bodies 26 and 28 to connect tester board 18 to device-side board 22. Tester board 18, which electrically connects test head 16 to interface conductors 30 along tester-side body 26, is customized to match head 16. Different implementations of board 18 thereby permit interface module 20 to be utilized with different versions of head 16. In the large majority of state-of-the-art test systems that provide stimulation/response-monitoring capabilities, head 16 and board 18 have outer lateral peripheries that are approximately circular in shape. Device-side board 22 which connects interface conductors 30 to the pins of DUT 10, is similarly customized for testing DUT 10. Different versions of board 22 enable module 20 to be employed with different implementations of DUT 10.

During test operation, test equipment 12 generates electrical signals which are supplied through components 14, 16, 18, 20, and 22 to stimulate DUT 10. The resulting electrical response from DUT 10 is then furnished in the other direction through components 22, 20, 18, 16, and 14 to test equipment 12 for evaluation. The electron-beam probe in device chamber 24 non-intrusively probes DUT 10 to form an image of a portion of DUT 10. The probing may be done as test signals generated by equipment 12 are used to stimulate DUT 10.

One conventional example of interface module 20 suitable for interfacing an electron-beam probe system, such as the Schlumberger IDS 10000 probe system, to a test system, such as the Schlumberger ITS 9000 test system, which provides a stimulation/response-monitoring capability is the Schlumberger 768 pin interface load module. FIG. 2a perspectively illustrates the Schlumberger 768 pin load module. FIG. 2b depicts tester-side body 26 of the load module. FIG. 2c illustrates how the module connects tester board 18 to device-side board 22. FIG. 2c also depicts the generally circular outer lateral periphery of tester board 18.

Tester-side body 26 in the Schlumberger 768 pin load module contains four physically separate tester-side portions 32 having tester-side openings through which interface conductors 30 pass. The tester-side openings are arranged in a pattern whose outer periphery is shaped generally like a square. See FIG. 2b. Device-side body 28 similarly contains four physically separate device-side portions 34 having device-side openings through which conductors 30 also pass. As indicated in FIG. 2a, the device-side openings are arranged in a pattern whose outer periphery is likewise shaped generally like a square. Although difficult to see in FIGS. 2a and 2b, conductors 30 protrude sufficiently far out of these openings to contact electrical contacts, e.g., metal pads, on boards 18 and 22.

Each device-side portion 34 is situated largely opposite a corresponding one of tester-side portions 32 to form a combination that utilizes one quarter of the total number, i.e., 768, of interface conductors 30 in the Schlumberger 768 pin load module. Each combination of one tester-side portion 32, corresponding device-side portion 34, and the associated quarter of interface conductors 30 can be removed as a unit from the Schlumberger 768 pin load module. This facilitates repairing the load module should one of these units fail. However, the module has only 768 conductors 30 and thus is limited to use in testing implementations of DUT 10 having no more than 768 pins.

ICs having more than 768 pins are being fabricated now and are expected to become more prevalent in the future. Accordingly, it is desirable to have a module which can accommodate considerably more than 768 pins as it interfaces between a non-intrusive probe system and an automated test system having a stimulation/response-monitoring capability. It is also desirable that such an interface module be easy to repair.

GENERAL DISCLOSURE OF INVENTION

The present invention furnishes an interface module which, when installed in a test system, enables the system to test or/and examine an electronic device, typically an integrated circuit, having a large number of external electrical leads, e.g., pins. The module of the invention is suitable for interfacing between a state-of-the-art non-intrusive probe system and a state-of-the-art test system that provides a stimulation/response-monitoring capability and, when utilized in such an overall test system, can readily accommodate an IC having considerably more than 768 pins. The present interface module is also typically configured to facilitate module repair.

More particularly, an interface module in accordance with the invention is intended to be situated between (a) a test mechanism having multiple electrical tester contacts for carrying test signals and (b) a device-side board (or card) having multiple electrical device-side contacts for connection to external electrical leads of an electronic device, such as an IC, under test. The test signals may include power supply signals. The interface module contains a tester-side body, a device-side body, and a group of electrical interface conductors.

The tester-side body of the present interface module normally contains at least five physically separate generally wedge-shaped tester-side portions laterally arranged so that their tips are directed generally toward one another. The number of wedge-shaped tester-side portions is normally a multiple of four, eight being the lowest such multiple. Each tester-side portion has multiple tester-side openings suitable for being positioned opposite corresponding ones of the tester contacts of the test mechanism.

The device-side body of the interface module has multiple device-side openings suitable for being positioned opposite the device-side contacts of the device-side board. Each interface conductor extends through one of the tester-side openings and through a corresponding one of the device-side openings for connecting one of the tester-side contacts to a corresponding one of the device-side contacts.

The tester-side openings in the tester-side body are preferably arranged in a pattern whose outer periphery is shaped generally like a circle or a polygon having at least five sides. In the case of a polygon, each side of the polygon corresponds to a different one of the tester-side portions. Multiple ones of the tester-side openings in each tester-side portion define the corresponding side of the polygon. The polygon is typically a regular polygon, i.e., a polygon whose sides are of equal length and whose angles are of equal value.

As mentioned above, both the test head and the adjoining tester board in the large majority of state-of-the-art automated test systems which provide stimulation/response-monitoring capabilities have outer lateral peripheries of generally circular shape. As a result, the area available for tester-side openings in an interface module adjoining the tester board is typically approximately circular in shape. However, the outer periphery of the pattern of tester-side openings in the tester-side body of the conventional interface module described above in connection with FIGS. 2a–2c is generally square shaped. Hence, the tester-side body of the conventional interface module does not utilize all of the area available for tester-side openings in a test system where the part of the test system adjoining the tester-side body is generally circular in shape.

A regular polygon which has five or more sides and which is situated inside a given circular area so that the polygon's sides all touch the periphery of the circular area occupies a greater fraction of the circular area than does a square situated in the circular area so that the square's sides likewise all touch the periphery of the circular area. By arranging the tester-side openings in the tester-side body of the present interface module to be in a pattern whose outer periphery is shaped generally like a circle or a regular polygon having five or more sides, the tester-side body of the present module can readily utilize more of the normally circular area available for tester-side openings than does the tester-side body of the conventional interface module described above. Consequently, the tester-side body of the present interface module can readily have more, often considerably more, tester-side openings than the conventional interface module without increasing the areal density of the tester-side openings.

As also indicated above, each interface conductor in the present interface module passes through one of its device-side openings on the way to contacting one of the device-side contacts of the device-side board. Since the present module can have an increased number of tester-side openings relative to the conventional interface module described above, the device-side board can also have an increased number of device-side contacts. Accordingly, the interface module of the invention normally enables the test system to test/examine an electronic device having more external electrical leads than can be examined in a test system utilizing the conventional interface module.

The device-side body of the present interface module normally contains at least five physically separate device-side portions respectively corresponding to the tester-side portions of the tester-side body. Each device-side portion has multiple ones of the device-side openings. The interface module is arranged so that one of the interface conductors passes through one of the device-side openings of each device-side portion and then through one of the tester-side openings of the corresponding tester-side portion. Each tester-side portion, the corresponding device-side portion, and the associated interface conductors preferably form a unit which is removable from the interface module separately from each other such unit. This removability characteristic enables the module to be repaired easily.

The interface module of the invention can be modified in various ways. In one variation, the tester-side body can have as few as two physically separate tester-side portions which are laterally arranged so that their outer lateral peripheries are, as a group, shaped generally like a circle. The remainder of the interface module is arranged generally as described above except that the device-side body can similarly have as few as two physically separate device-side portions respectively corresponding to the tester-side portions. This variation enables the test system to test/examine an electronic device having an increased number of external electrical leads while still facilitating repair of the module.

The present invention also furnishes a test system for testing or/and examining an electronic device such as an IC. The test system contains a test mechanism, an interface module, and a device-side board all generally configured as specified above in connection with the present interface module. The test mechanism preferably includes a test head and a tester board attached to the test head. The tester board has the tester contacts which contact the interface conductors of the interface module. By customizing the test board to the characteristics of the test head, the interface module of the invention can be utilized with different versions of the test head.

The present test system normally includes a probe for probing the device under test in a largely non-intrusive manner. The probe is preferably positioned so as to probe the device under test from an opposite location to where the device-side board receives the device under test. In a preferred implementation, the device-side body of the interface module is physically coupled to the tester-side body substantially only through electrical interface conductors that pass through openings in the testers and device-side bodies. This largely isolates the probe from the test mechanism. Consequently, vibrations that may occur in the test mechanism are largely prevented from being transmitted to the probe and disturbing its diagnostic function.

BRIEF DESCRIPTION OF THE DRAWINGS

FIG. 2b is a plan view of the tester side of the interface module of FIG. 2a.

Like reference symbols are employed in the drawings and in the description of the preferred embodiments to represent the same, or very similar, item or items.

DESCRIPTION OF THE PREFERRED EMBODIMENTS

Figure 3:
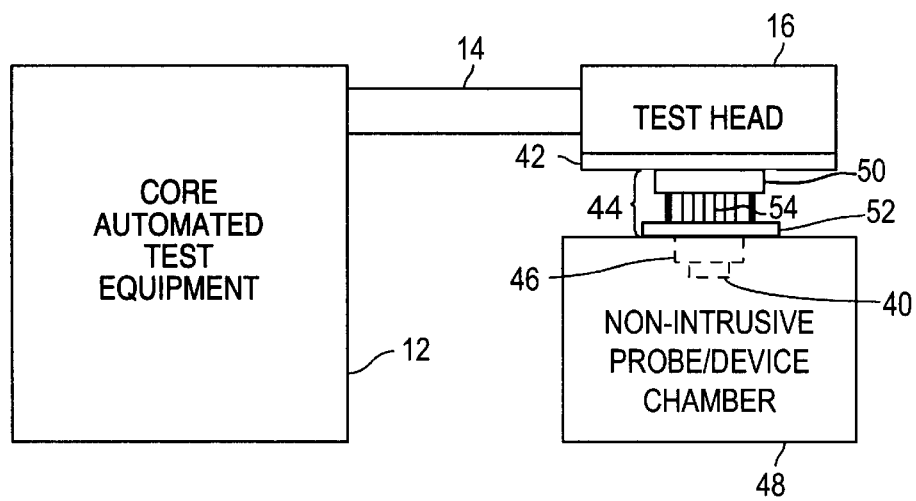
FIG. 3 is a block diagram of a test system according to the invention.

FIG. 3 illustrates a test system configured in accordance with the invention for testing or/and examining an electronic device 40. The test system of FIG. 3 furnishes a digital test capability and, optionally, an analog test capability. Hence, DUT 40 can be a digital device or, optionally, a device having both digital and analog (mixed-signal) circuitry. By suitably implementing the test system of FIG. 3, DUT 40 can also be solely an analog device.

Figure 1:
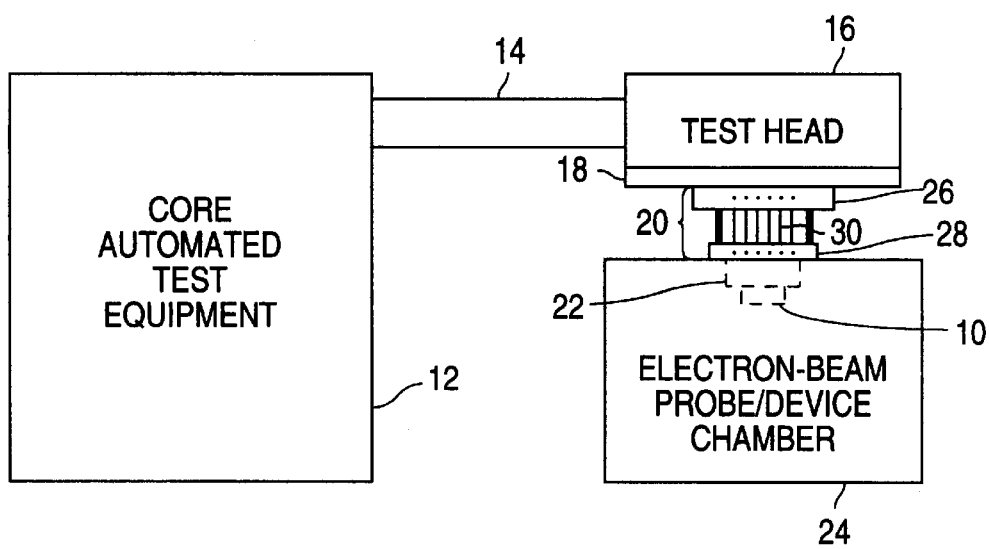
FIG. 1 is a block diagram of a conventional test system.
Figure 2A:
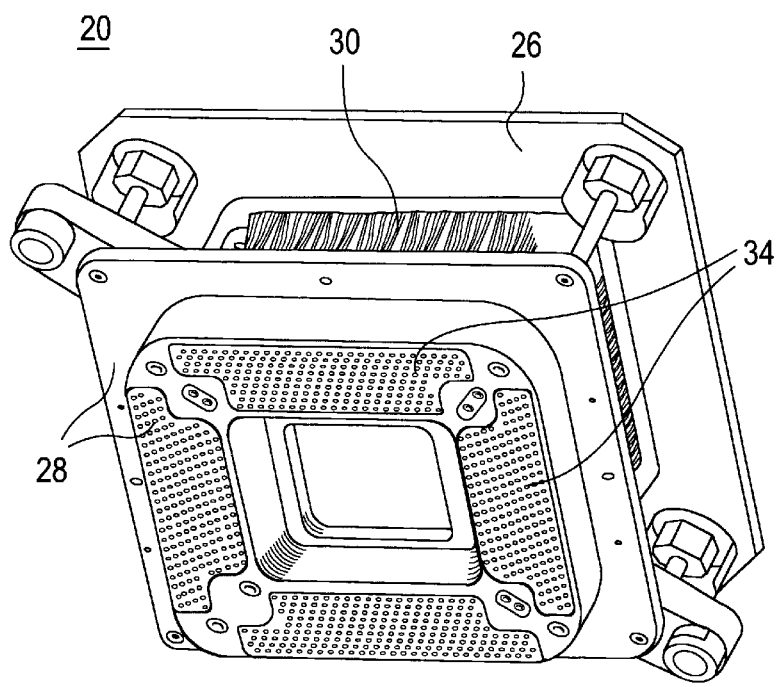
FIG. 2a is a perspective view of a conventional interface module employed in the test system of FIG. 1.
Figure 2B:
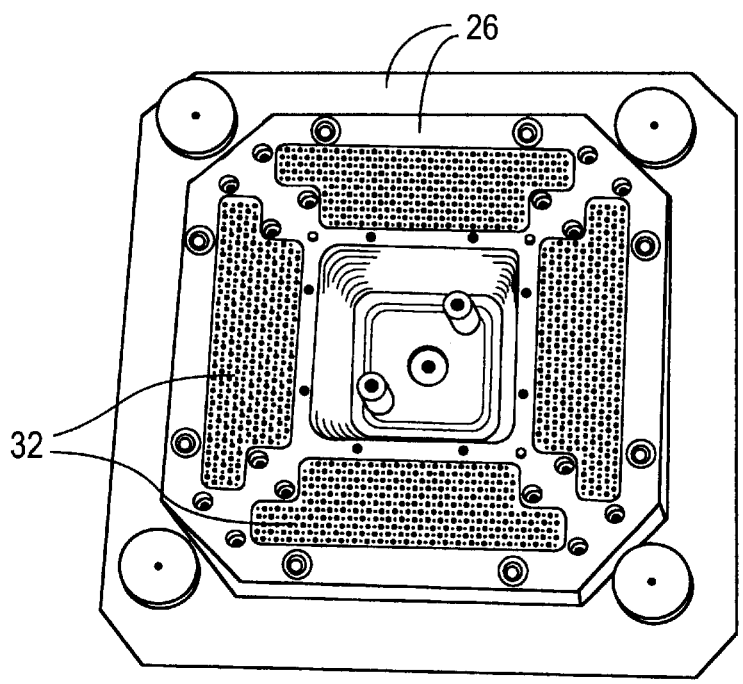
Figure 2C:
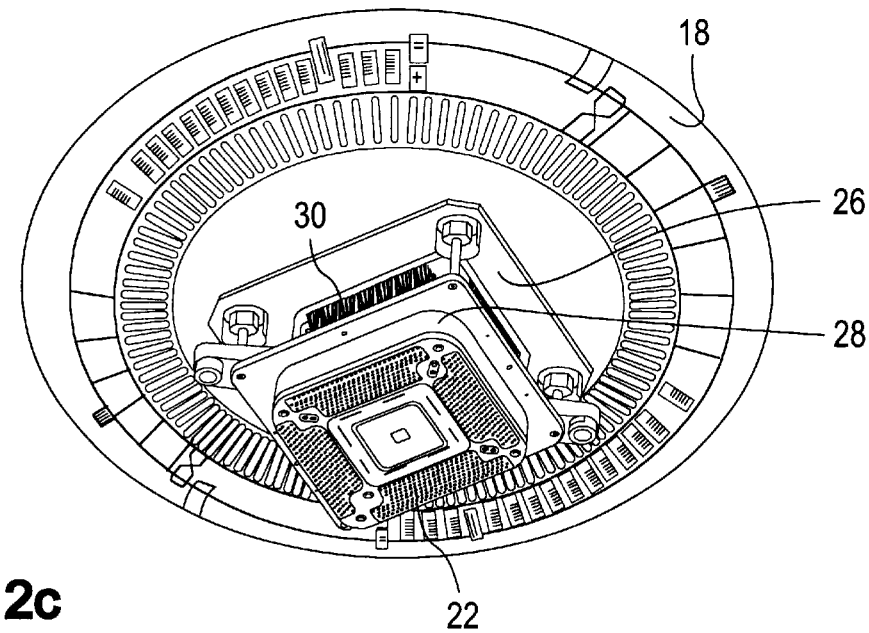
FIG. 2c is a perspective view of the interface module of FIG. 2a as that module is positioned between the tester and device-side boards in the test system of FIG. 1.

Compared to the situation in which interface module 20 in the conventional test system of FIG. 1 is implemented with the Schlumberger 768 pin load module, the test system of FIG. 3 is configured to enable DUT 40 to have considerably more external electrical leads than DUT 10. In one embodiment, DUT 40 can have up to 1024 external electrical leads for transmitting digital signals and, depending on the power supply requirements of DUT 40, often slightly more than 1024 external electrical leads for transmitting digital signals. DUT 40 is typically an IC. However, DUT 40 can be another type of electronic device such as a multi-chip module.

The inventive test system of FIG. 3 consists of core automated test equipment 12, manipulator 14, test head 16, a tester load board 42, an interface module 44, a device-side board (or card) 46, and a device chamber 48 which contains a non-intrusive probe (not separately shown). Analogous to where DUT 10 and device-side board 22 are located in the conventional test system of FIG. 1, DUT 40 here is situated in device chamber 48 and attached to device-side board 46 also situated in chamber 48. The non-intrusive probe in chamber 48 can function by directing electrons toward DUT 40 in a manner similar to how the electron-beam probe operates in the test system of FIG. 1. The non-intrusive probe in the test system of FIG. 3 can also direct other type of radiation, such as light or ions, toward DUT 40. To enable a non-intrusive probe that requires a high vacuum to be utilized in device chamber 48, interface module 44 is normally airtight along device-side board 46.

Interface module 44 is configured according to the invention for enabling DUT 40 to have the above-mentioned increased number of external electrical leads, e.g., pins when DUT 40 is an IC, for transmitting digital signals. Interface module 40 contains a tester-side body 50, a device-side body 52, and a group of digital-capability electrical interface conductors 54. The number of digital-capability interface conductors 54 is normally slightly greater than the maximum number, e.g., 1024, of external electrical leads that DUT 40 has for transmitting digital signals. Conductors 54 pass through openings (not shown here) in bodies 50 and 52 for electrically connecting tester-side digital-capability electrical contacts (also not shown here) of tester board 42 respectively to device-side digital-capability electrical contacts (likewise not shown here) of device-side board 46. When an analog-capability is needed, module 44 also has a group of analog-capability electrical interface conductors (not shown here) that pass through openings in bodies 50 and 52 for electrically connecting tester-side analog-capability electrical contacts of tester board 42 respectively to device-side analog-capability electrical contacts of device board 46.

Tester board 42 electrically connects test head 16 to digital-capability interface conductors 54 and the optional analog-capability interface conductors along tester-side body 50. As with tester board 18 above, tester board 42 here is customized to match test head 16. Accordingly, different implementations of board 42 enable interface module 44 to be utilized with different versions of test head 16. Board 42 typically has an approximately circular outer lateral periphery. Nonetheless, the outer lateral periphery can be substantially non-circular, e.g., rectangular or, in particular, square.

Tester board 46 electrically connects digital-capability interface conductors 54 and the optional analog-capability interface conductors to the external electrical leads of DUT 40. Similar to device-side board 22, device-side board 46 is customized to match DUT 40. Different versions of board 46 enable interface module 44 to be utilized with different implementations of DUT 40.

Aside from the increased lead-handling capability provided by interface module 44 and any test-equipment enhancements or other changes needed to accommodate the increased lead-handling capability, components 12, 14, 16, 42, 44, and 46 in the test system of FIG. 3 operate respectively the same as components 12, 14, 16, 18, 20, and 22 in the test system of FIG. 1. During test operation, test equipment 12 in the test system of FIG. 3 thus generates electrical test signals which are furnished through components 14, 16, 42, 44, and 46 to stimulate DUT 40. The test signals normally include power supply signals. The resulting electrical response from DUT 40 is furnished in the other direction through components 46, 44, 42, 16, and 14 to test equipment 12 for evaluation.

The non-intrusive probe in device chamber 46 non-intrusively probes DUT 40. Depending on how the non-intrusive probe is implemented, the probing operation on DUT 40 can be performed anywhere from room pressure, typically 1 atmosphere, down to a high vacuum, e.g., $10^{-6}$ torr or lower. The non-intrusive probe is an electron-beam probe operated at a high vacuum according to a scanning-electron-microscope technique in one embodiment. In that case, the test system of FIG. 3 combines an electron-beam probe system, such as the Schlumberger IDS 10000 system, with automated test equipment, such as the Schlumberger ITS system, which provides a stimulation/response-monitoring test capability. Device chamber 46 in the test system of FIG. 3 is then electron-beam probe system 22 in the test system of FIG. 1. Interface module 20 can, of course, be utilized with other non-intrusive probe systems and with other automated test equipment that implements components 12, 14, and 16.

Figure 6:
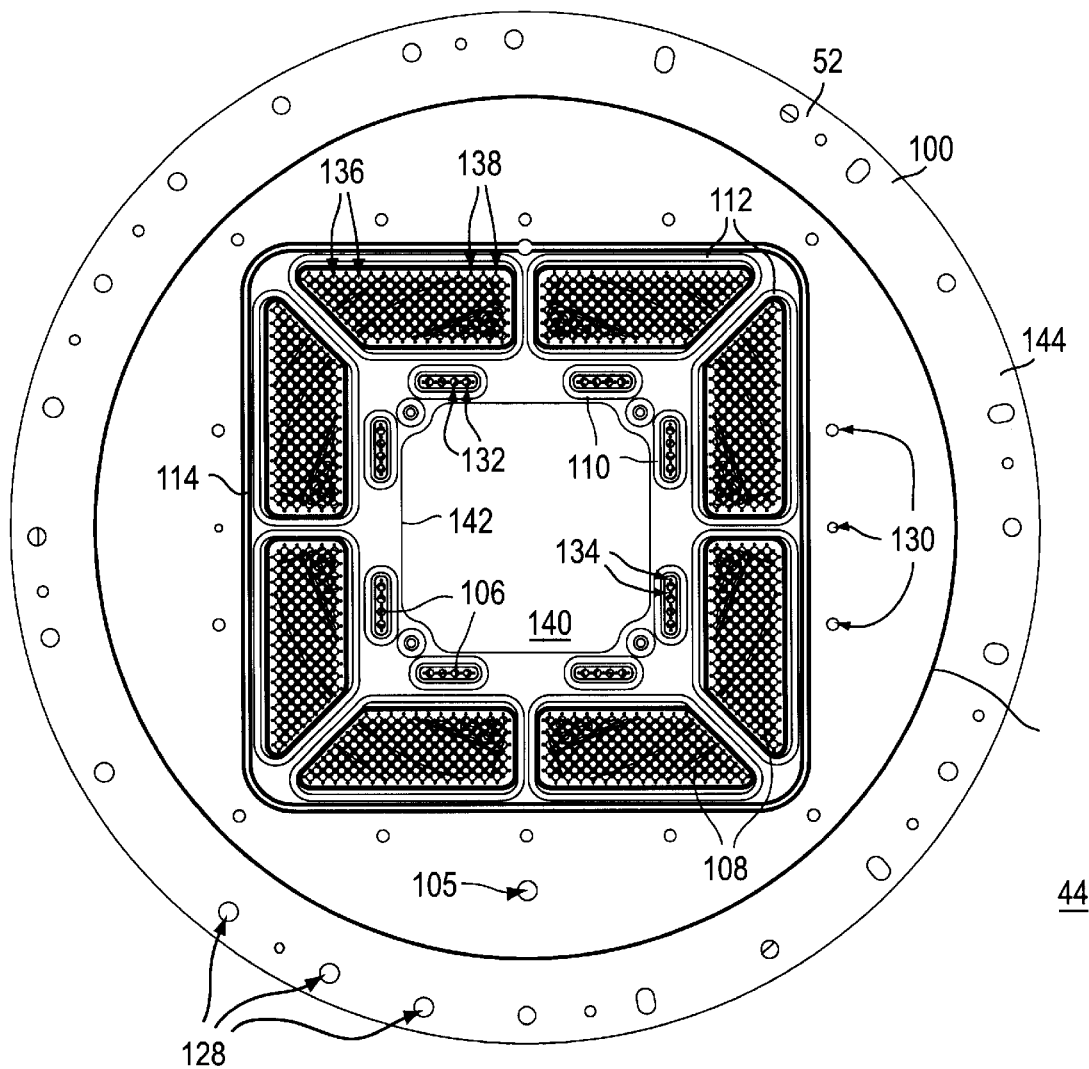
Figure 7:
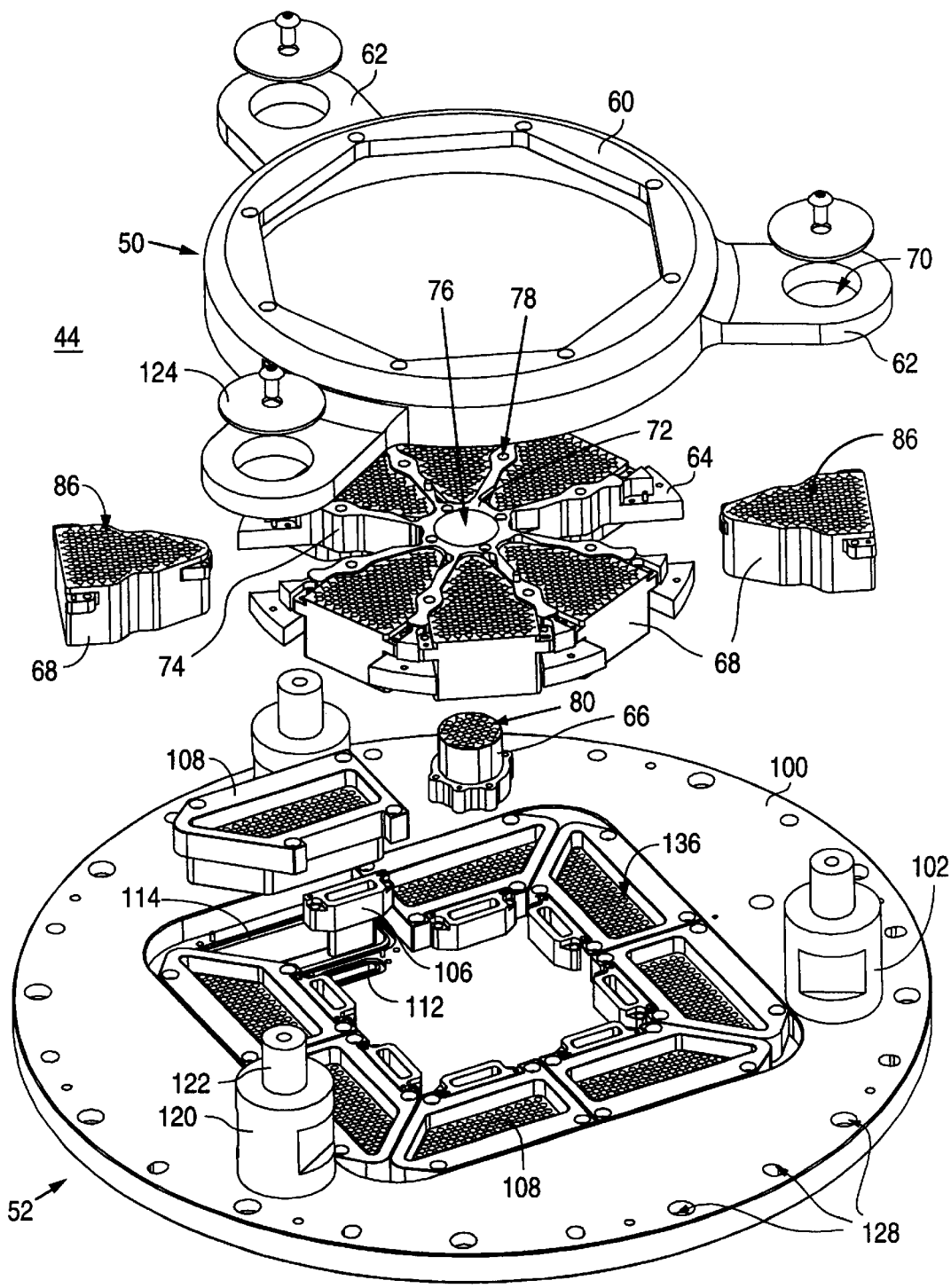
FIG. 7 is an exploded perspective view of the interface module, again excluding the interface conductors, of FIG. 4.
Figure 8:
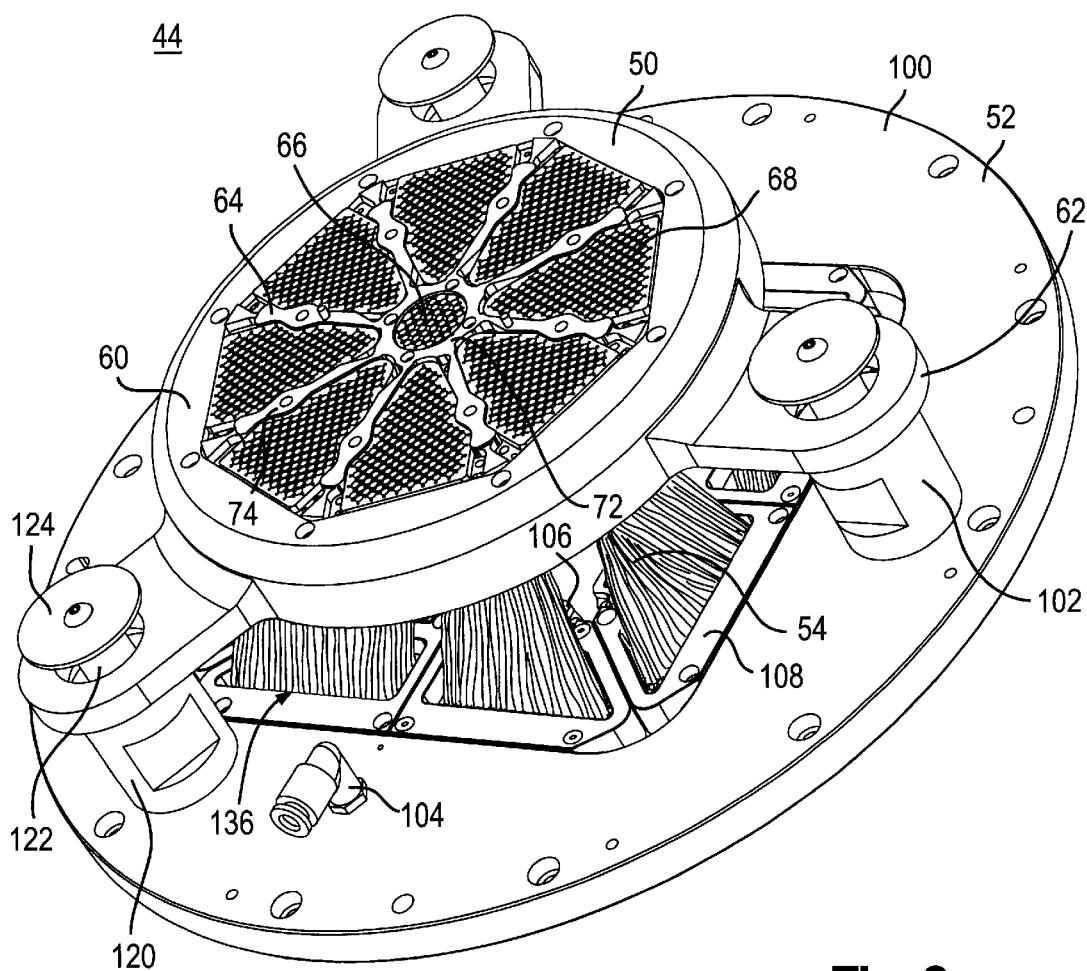
FIG. 8 is a perspective view of the interface module, now including the interface conductors, of FIG. 4.

FIGS. 4–10 present various views, including partial views, of an embodiment of interface module 44 which enables DUT 40 to have up to 1024 external electrical leads for transmitting digital signals and, optionally, up to 32 analog-capability external electrical leads for transmitting analog signals. FIGS. 4–7, 9, and 10 variously illustrate the elements of module 40 except for digital-capability interface conductors 54 and the optional analog-capability interface conductors. Digital-capability conductors 54 are depicted in FIG. 8.

Figure 4:
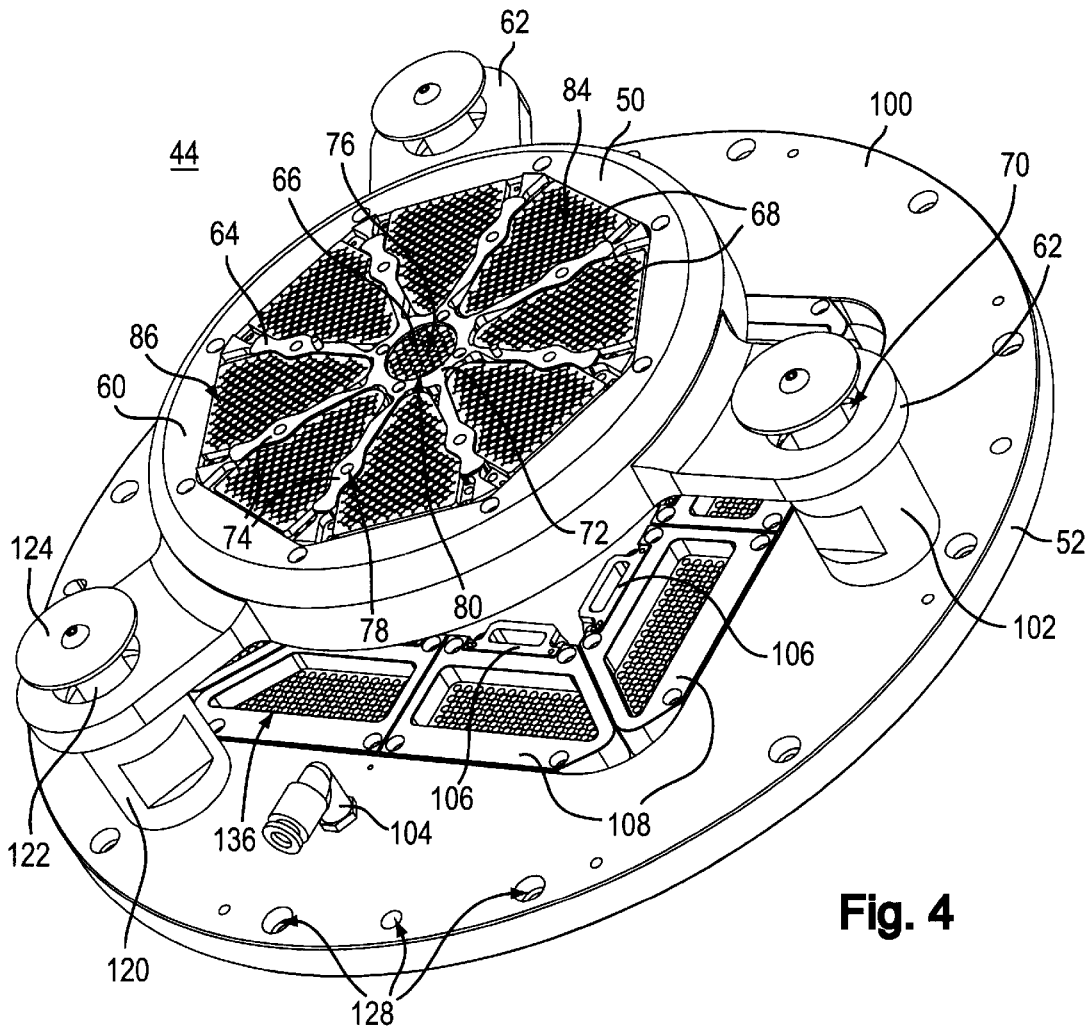
FIG. 4 is a perspective view of an interface module, excluding the module's electrical interface conductors, configured according to the invention for usage in the test system of FIG. 3.
Figure 5:
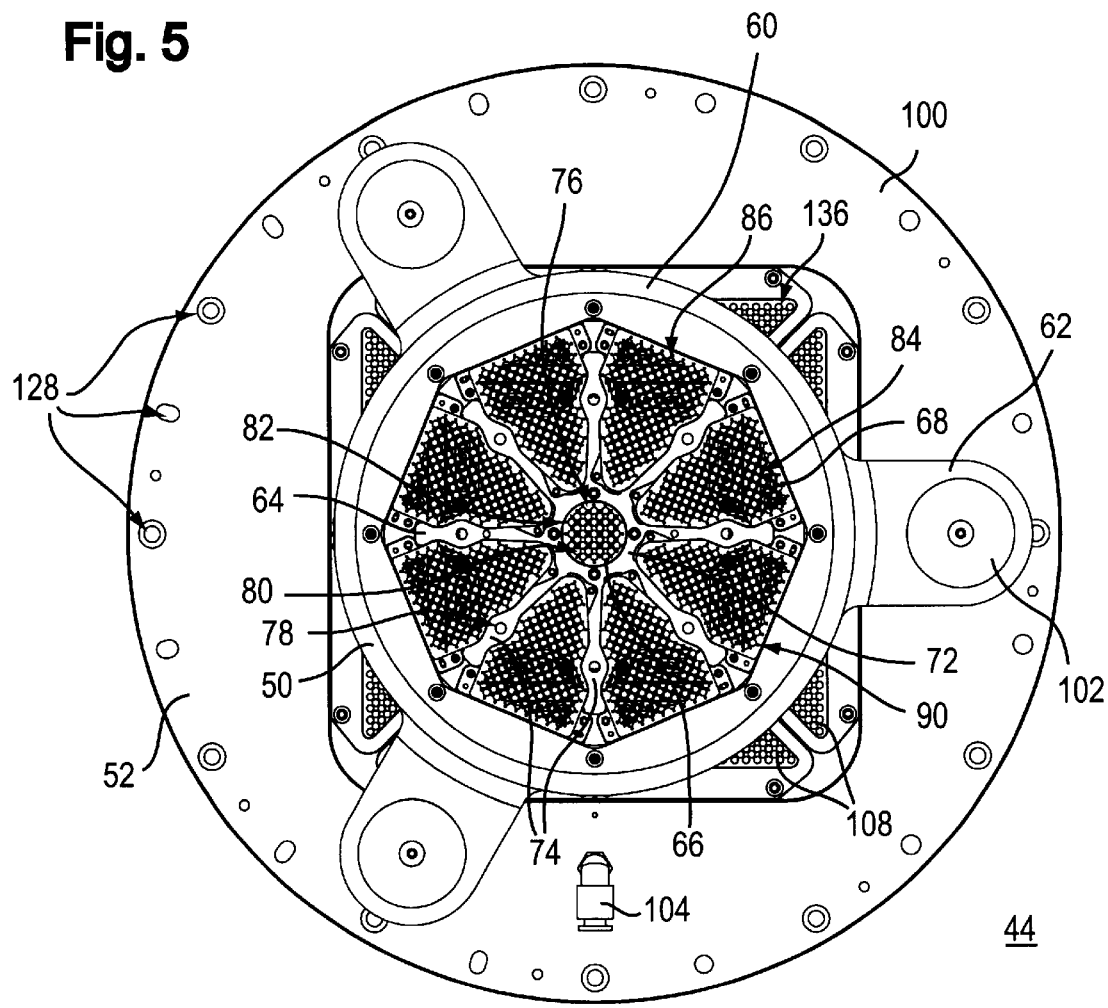
FIGS. 5 and 6 are tester-side and device-side views of the interface module of FIG. 4.
Figure 9:
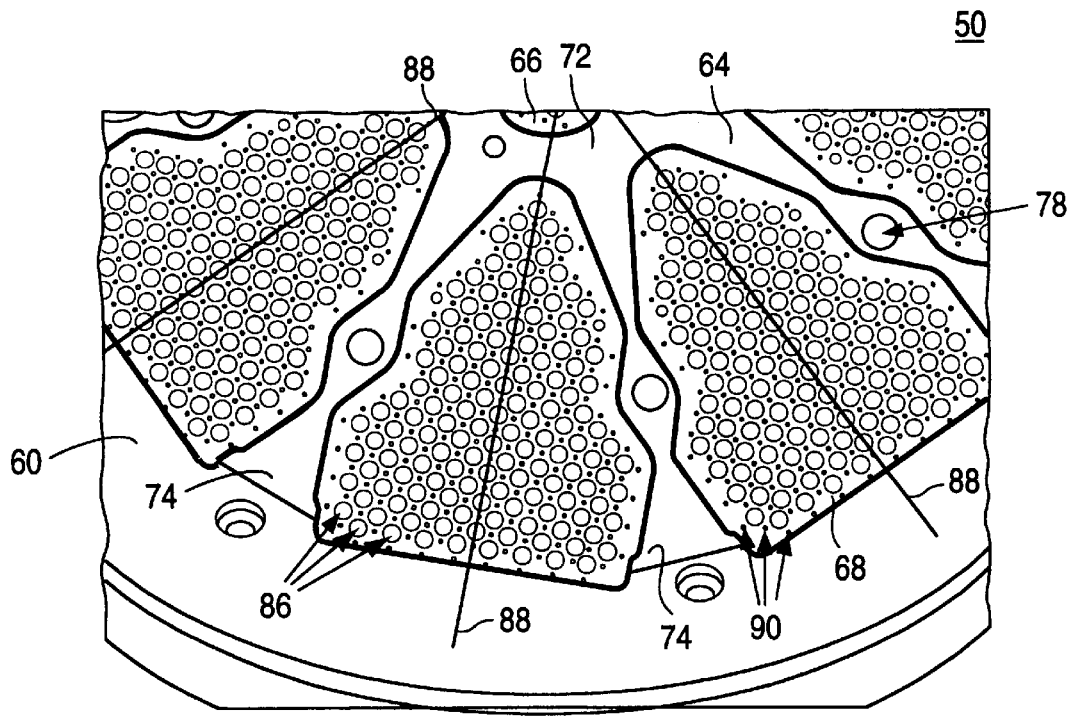
FIGS. 9 and 10 are enlarged perspective views of parts of the tester-side and device-side bodies of the interface module of FIG. 4.
Figure 10:
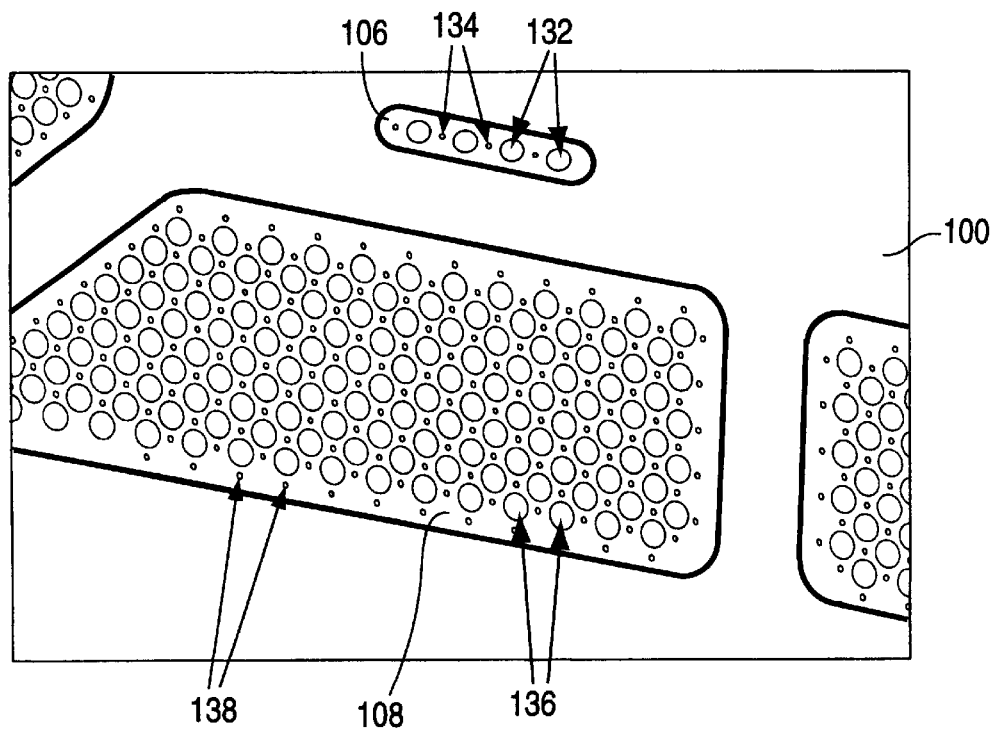

More particularly, FIG. 4 is a general perspective view of all of interface module 44 (except for digital-capability interface conductors 54 and the optional analog-capability interface conductors). FIG. 5 is a plan view as seen from the tester side (top side in FIG. 3) of module 44. FIG. 6 is a plan view as seen from the device side (bottom side in FIG. 3) of module 44. FIG. 7 is an exploded perspective view of module 44. Except for the inclusion of digital-capability conductors 54, FIG. 8 presents the same perspective view as FIG. 4. FIG. 9 is an enlarged view of part of tester-side body 50. FIG. 10 is an enlarged view of part of device-side body 52.

Tester-side body 50 in the example of FIGS. 4–10 consists of an annular tester-side main portion 60, three largely identical protective flanges 62, a spider-shaped tester-side member 64, a circular cylindrical tester-side portion 66 utilized in providing the optional analog test capability, and eight largely identical generally wedge-shaped tester-side portions 68 employed in providing the digital test capability. Components 60, 62, 64, 66, and 68 are all formed with metal, typically an aluminum alloy, and are therefore electrically conductive. Cylindrical tester-side analog-capability portion 66 can be deleted from tester-side body 50 if an analog test capability is not needed.

Tester-side main portion 60 has a circular outer lateral periphery and an upper inner lateral periphery roughly in the shape of a regular octagon. The outside diameter of main portion 60 is 16–20 cm, typically 18.4 cm. Protective flanges 62 protrude from the outside lateral periphery of main portion 60 and are spaced approximately equidistant from one another. A circular opening 72 extends through each flange 62.

Spider-shaped member 64 consists of a central portion 72 and eight largely identical ribs 74 extending laterally away from central portion 72 at largely equal angles. A circular central opening 76 extends through central portion 72. Each rib 74 widens partway along its length at a location where a mounting hole 78 extends through that rib 74. The centers of mounting holes 78 are situated on an imaginary circle having a radius of 4–5 cm, typically 4.7 cm. Tester-side body 50 is physically connected to tester board 42 by way of bolts inserted into mounting holes 78.

Ribs 74 narrow after passing mounting holes 78 in moving away from the center of spider-shaped member 64. Each rib 74 again widens near its outer end. Member 64 is located inside the inner lateral periphery of tester-side main portion 60 and is attached to main portion 60 along an outer flange of each rib 74. Each attachment location, and thus the outer edge of each rib 74, occurs where two consecutive sides of the regular octagonal inner laterally periphery of main portion 60 meet.

Cylindrical analog-capability portion 66, when present, is situated in central opening 76 of central portion 72 of spider-shaped member 64. Cylindrical portion 66 is attached to member 64 along a widened lower part of portion 66. Although attached to member 64, cylindrical portion 66 is electrically insulated from member 64 and from other electrically conductive parts of tester-side body 50 by way of electrical insulation (not shown) situated around portion 66. As described further below, cylindrical portion 66 receives ground potential from the analog-capability interface conductors during test operation.

37 equal-size tester-side analog-capability openings 80 extend through cylindrical portion 66. 40 equal-size tester-side analog-ground openings 82 extend partway into cylindrical portion 66 along its top side. See FIG. 5. Tester-side analog-ground openings 82 are of considerably smaller average diameter than tester-side analog-capability openings 80. Analog-ground openings 82 are distributed in such a way that at least two openings 82 are directly adjacent to each analog-capability opening 80. Each analog-ground opening 82 contains an analog-ground pin discussed below.

A wedge has a plane shape in which three lines, referred to here as the base and the two sides, meet each other at angles. The two sides of the wedge are straight and typically of the same, or close to the same, length. The base of the wedge can be straight. In that case, the wedge is an isosceles triangle. The wedge's base can also be curved. If the base is circularly curved in a convex manner relative to the sides of the wedge, the wedge has the form of a piece of pie.

In the example of FIGS. 4–10, each wedge-shaped digital-capability portion 68 is roughly shaped like an isosceles triangle. More particularly, each portion 68 in the embodiment of FIGS. 4–10 is shaped like the vertical profile of a pine tree, i.e., like an isosceles triangle except that the two sides of the triangle are replaced with wavy lines. As described further below, the base of each portion 68 can be significantly curved, typically circularly curved in a convex manner so that each portion 68 is roughly shaped like a piece of pie.

The combination of tester-side main portion 60 and spider-shaped member 64 defines eight largely identical generally wedge-shaped openings 84 whose tips are directed toward the center of tester-side main portion 60 and thus toward one another. Wedge-shaped openings 84 are of largely the same size and shape as wedge-shaped portions 68. Consequently, each opening 84 in the embodiment of FIGS. 4–10 is roughly shaped like an isosceles triangle or, more specifically, like the vertical profile of a pine tree.

Each of wedge-shaped portions 68 fits snugly into a corresponding (different) one of wedge-shaped openings 84. Accordingly, portions 68 are laterally arranged so that their tips are directed toward the center of main portion 60 and thus toward one another. Ribs 74 of spider-shaped member 72 physically separate portions 68 from one another. Because portions 68 are roughly shaped like isosceles triangles or, more particularly, like the vertical profiles of pine trees, the outer laterally peripheries of portions 68 are, as a group, shaped approximately like a regular octagon. Even more particularly, portions 68 form, as a group, an annular pattern having a generally circular inner periphery and a roughly octagonal outer periphery since portions 68 laterally surround circular cylindrical portion 66.

Each wedge-shape portion 68 is attached to spider-shaped member 64 along the two adjacent ones of ribs 74. In particular, each portion 68 has two flanges which protrude outward along the base of that portion 68 and which are attached to the outer flanges of the two adjacent ribs 74. Each portion 68 also has an additional flange located near the tip of that portion 68 and attached to an additional flange of one of the two adjacent ribs 74.

Wedge-shaped portions 68 are electrically connected to one another through spider-shaped member 64. As described further below, portions 68 receive ground potential from digital capability interface conductors 54 during test operation. Consequently, portions 68 are at a common digital ground potential during test operation. Inasmuch as cylindrical analog-capability portion 66 is electrically insulated from other electrically conductive parts of tester-side body 50 and thus from wedge-shaped portions 66, the analog ground on cylindrical portion 66 is isolated from the common digital ground on wedge-shaped portions 68.

Importantly, wedge-shaped portions 68 closely match the lateral contours of ribs 74. Each portion 68 has a pair of notches (or lateral depressions) where the two adjoining ribs 74 widen partway along their lengths. These notches in the sides of portions 68 and the widened portions of ribs 74 enable portions 68 to be positioned very accurately in wedge-shaped openings 82. The alignment of portions 68 to mounting holes 78, and thus to tester board 42, is excellent.

140 equal-size tester-side digital-capability openings 86 extend through each wedge-shaped portion 68. Tester-side digital-capability openings 86 of each portion 68 are distributed across largely all of that portion 68 to form an annular pattern whose outer lateral periphery is roughly wedge shaped. Accordingly, the outer lateral periphery of the pattern of openings 86 in each portion 68 in the example of FIGS. 4–10 is roughly shaped like an isosceles triangle or, more particularly, like the vertical profile of a pine tree. In any event, the base of the wedge-shaped outer lateral periphery of the pattern of openings 86 in each portion 68 is largely straight in the example of FIGS. 4–10.

Tester-side digital-capability openings 86 are arranged in rows and columns in each wedge-shaped portion 68. The row/column arrangement can be clearly seen in FIG. 9. The columns of openings 86 in each portion 68 extend parallel to one another and parallel to the longitudinal axis 88 of that portion 68. Longitudinal axes 88 all intersect at the center of tester-side main portion 60. The number of openings 86 in each column of openings 86 in each portion 68 decreases generally in moving away from longitudinal axis 88 of that portion 68. The rows of openings 86 extend parallel to one another and perpendicular to the columns of openings 86. Except near the base of each portion 68, the number of openings 86 in each row of openings 86 in that portion 68 decreases generally in moving away from the base of that portion 68 toward its tip.

Digital-capability openings 86 in each wedge-shaped portion 68 are distributed in a relatively uniform manner across that portion 68. Accordingly, the spacing between consecutive columns of openings 86 in each portion 68 is largely the same. Likewise, the spacing between consecutive rows of openings 86 in each portion 68 is largely the same. The inter-row spacing also approximately equals the inter-column spacing. The density of openings 86 in each portion 68 is 2–4 openings/cm$^2$, typically 3 openings/cm$^2$.

Digital-capability openings 86 in each pair of consecutive columns, or generally center-directed longitudinal lines, of openings 86 in each wedge-shaped portion 68 are staggered relative to one another. In particular, each column of openings 86 is formed with openings 86 from alternative rows of openings 86. Openings 86 in each pair of consecutive rows, or transverse lines, of openings 86 in each portion 68 are similarly staggered relative to one another.

The total number of digital-capability openings 86 is 1120, i.e., 140 times 8, the number of wedge-shaped portion 68. Since the base of the wedge-shaped outer lateral periphery of the pattern of openings 86 in each portion is largely straight in the example of FIGS. 4–10, the 1120 openings 86 are, as a group, arranged in a pattern whose outer lateral periphery is shaped roughly like a regular octagon in the example of FIGS. 4–10. Each side of the octagon is formed by the base of the wedge-shaped outer lateral periphery of the pattern of openings 86 in a corresponding one of portions 68. Multiple ones, eight in the example of FIGS. 4–10, of openings 86 in each portion 68 define the corresponding side of the octagon.

In addition to digital-capability openings 86, 173 equal-size tester-side digital-ground openings 90 extend partway into each wedge-shaped portion 68 along its top side. See FIGS. 5 and 9. Tester-side digital-ground openings 90 are of considerably smaller average diameter than openings 86. Digital-ground openings 90 are arranged in rows and columns in the same way as openings 86. Four of digital-ground openings 90 are directly adjacent to each digital-capability opening 86. Each digital-ground opening 90 contains a digital-ground pin discussed below.

Rather than being generally straight, the base of each wedge-shaped portion 68 can be significantly curved, typically circularly curved in a convex manner. When the bases of portions 68 are generally circularly curved in a convex manner, the outer lateral periphery of portions 68 are, as a group, shaped approximately like a circle. In that case, the outer lateral periphery of the pattern of digital-capability openings 86 in each portion 68 can be shaped roughly like a piece of a pie. The outer lateral periphery of the pattern of all of openings 86 is, as a group, then shaped roughly like a circle. Arranging portions 68 and openings 86 in this manner may enable the total number of openings 86 to be increased further without changing the areal density of openings 86.

Device-side body 52 in the embodiment of FIGS. 4–10 consists of a device-side main portion 100, three largely identical protective posts 102, an L-shaped pipe fitting 104, eight generally rectangular-shaped device-side portions 106 utilized in providing the optional analog test capability, eight generally right-trapezoidal-shaped device-side portions 108 employed in providing the digital test capability, eight roughly rectangular sealing rings 110, eight roughly right-trapezoidal sealing rings 112, and a largely square sealing ring 114. Components 100, 102, 104, 106, and 108 are formed with metal, typically an aluminum alloy, except possibly for pipe fitting 104 and the screws and washers used in protective posts 102. Accordingly, components 100, 102, 106, and 108 are electrically conductive. Sealing rings 110, 112, and 114, which only appear in FIG. 6, consist of suitable rubber or rubber-like sealing material.

Protective posts 102 are attached to the top of device-side main portion 100 at locations approximately equidistant from one another and respectively opposite openings 70 in flanges 62 of tester-side body 50. Each post 102 consists of a lower circular cylindrical section 120, an upper circular cylindrical section 122 continuous with lower section 120, and a washer/screw combination 124 attached to the top of upper section 122 by the screw. Lower sections 120 are of significantly greater diameter than openings 70, whereas upper sections 122 are of significantly lesser diameter than openings 70. Upper sections 122 are respectively situated in openings 70 in such a way that posts 72 do not touch flanges 62 when interface module 44 is situated in an upright position and no disturbance is applied to module 44.

The combination of flanges 62 and protective posts 102 protects interface module 44 by preventing its shape from being distended significantly while module 44 is being handled. During normal test operation, flanges 62 do not touch posts 102. Consequently, vibrations that may occur in tester components 12, 14, and 16 are not transmitted to device-side body 52, device-side board 46, or DUT 40 through flanges 62 and posts 102.

Pipe fitting 104, shown in FIGS. 4, 5, and 8 but omitted from FIG. 7, is mounted on top of device-side main portion 100 and extends into an opening 105 which extends through main portion 100. FIG. 6 depicts opening 105. A vacuum pump is attached to fitting 104 when device chamber 48 is to be operated at high vacuum. The cavity between main portion main portion 100 and tester board 46 is pumped down by way of pipe fitting 104 and opening 105 to assist in reaching the high vacuum needed in chamber 48.

A group of holes 128 pass through device-side main portion 100 near its outer lateral periphery. Device-side body 52 is physically connected to device chamber 48 by way of bolts or screws inserted into selected ones of holes 128. A further group of holes 130 extend partway through main portion 100 from its bottom side. See FIG. 6. Holes 130 are arranged in a roughly square pattern and are situated outside the location, discussed further below, of device-side analog-capability portions 106 and device-side digital-capability portions 108. Device-side board 46 is attached to device-side body 52 by way of screws inserted through holes in board 46 and then into holes 130.

Rectangular-shaped analog-capability portions 106 are attached to device-side main portion 100 and arranged in an annular pattern of approximately square shape. Rectangular-shaped portions 106 are also situated in eight respective openings extending through main portion 100 opposite part of the location for device-side board 46. Each of rectangular-shaped sealing rings 110 surrounds the lateral periphery of a corresponding one of portions 106 along the bottom of main portion 100 so as to provide a hermetic seal between that rectangular-shaped portion 106 and device-side board 46. Although attached to main portion 100, rectangular-shaped portions 106 are electrically insulated from one another and from other electrically conductive parts of device-side body 52 by way of electrical insulation (not shown) situated around each portion 106. As described further below, portions 106 receive ground potential from the analog-capability interface conductors during test operation.

Four equal-size device-side analog-capability openings 132 extend in a straight line through each rectangular-shaped portion 106. See FIG. 6. Since there are eight portions 106, device-side body 52 has total of 32 openings 132. As a result, interface module 44 can be utilized in testing implementations of DUT 40 having up to 32 analog-capability external electrical leads. In addition, five equal-size device-side analog-ground openings 134 of considerably smaller average diameter than analog-capability openings 132 extend partway into each portion 106 along its bottom side. Each analog-capability opening 132 lies between a pair of analog-ground openings 134 in each portion 106. Each analog-ground opening 134 contains an analog-ground pin discussed below.

Trapezoidal-shaped digital-capability portions 108 are attached to device-side main portion 100 and arranged in a roughly square annular pattern situated outside the annular square pattern of rectangular-shaped portions 106. Four of trapezoidal-shaped portions 108 are largely identical to one another and are largely mirror images of the other four largely identical portions 108. Two mirror-image portions 108 form each side of the square annular pattern of portions 108. The slanted sides of portions 108 are at the corners of the pattern. The base, i.e., the longer of the two parallel sides, of the trapezoid roughly defined by each portion 108 is at the outside of the pattern.

Trapezoidal-shaped portions 108 are also situated in eight respective openings extending through tester-side main portion 100 opposite part of the location for tester board 46. Each of sealing rings 112 surrounds the lateral periphery of a corresponding one of portions 108 along the bottom side of main portion 100 so as to provide a hermetic seal between that portion 106 and board 46.

Trapezoidal-shaped portions 108 are electrically connected to each other through tester-side main portion 100. As described further below, portions 108 receives ground potential from digital-capability interface conductors 54 during test operation. Accordingly, portions 108 are at a common digital ground potential during test operation. Since rectangular-shaped analog-capability portions 106 are electrically insulated from other electrically conductive parts of device-side body 52 and thus from trapezoidal-shaped portions 108, the analog ground on each rectangular-shaped portion 106 is isolated from the common digital ground on trapezoidal-shaped portions 108.

140 equal-size device-side digital-capability openings 136 extend through each trapezoidal-shaped portion 108, Digital-capability openings 136 of each portion 108 are distributed across largely all of that portion 108 to form a pattern whose outer laterally periphery is shaped roughly like a right trapezoid.

Digital-capability openings 136 are arranged in rows and columns in each trapezoidal-shaped portion 108. The row/column arrangement of openings 136 can clearly be seen in FIG. 10. The rows of openings 136 in each pair of portions 108 which define one side of the square annular pattern formed by portions 108 extend parallel to that side of the pattern. The columns of openings 136 extend parallel to the rows. The number of openings 136 in each row of openings 136 of each portion 108 generally decreases in moving from the base of its trapezoidal shape toward the center of tester-side main portion 100. Openings 136 in each pair of consecutive rows or consecutive columns of openings 136 in each portion 108 are also staggered relative to one another.

Digital-capability openings 136 in each trapezoidal-shaped portion 108 are distributed in a relatively uniform manner across that portion 108, The spacing between consecutive rows and between consecutive columns in each portion 108 is largely the same. The density of openings 136 in each portion 108 is 2–4 openings/cm$^2$, typically 3 openings/cm$^2$.

As with tester-side digital-capability openings 86, the total number of device-side digital-capability openings 136 is 1120, i.e., 140 times 8, the number of device-side trapezoidal-shaped portions 108. The 1120 openings 136 are, as a group, arranged in an annular pattern whose outer lateral periphery is shaped roughly like a square. Each side of the square is formed by the bases of the trapezoidal-shaped outer lateral peripheries of the patterns of openings 136 in two adjacent corresponding mirror-image portions 108. Multiple ones, 16 in the example of FIGS. 4–10, of openings 136 in each portion 108 define one half of the corresponding side of the square.

178 equal-size device-side digital-ground openings 138 of considerably smaller average diameter than device-side digital-capability openings 136 extend partway into each trapezoidal-shaped portion 108 along its bottom side. See FIGS. 6 and 10. Device-side analog-ground openings 138 are arranged in rows and columns in the same manner as digital-capability openings 136. Four of digital-ground openings 138 are directly adjacent to each digital-capability opening 136. Each digital-ground opening 138 contains a digital-ground pin discussed below.

Each of device-side trapezoidal-shaped digital-capability portions 108 corresponds to a (different) one of tester-side wedge-shaped digital-capability portions 68. There are typically 1120 of digital-capability interface conductors 54. 140 of the 1120 digital-capability conductors 54 respectively extend from 140 digital-capability tester electrical contacts (not shown here) of tester board 42, through the 140 tester-side digital-capability openings 86 of each tester-side wedge-shaped portion 68, through the 140 device-side digital-capability openings 136 of corresponding device-side trapezoidal-shaped portion 108, and to 140 digital-capability device-side electrical contacts (not shown here) of device-side board 46. See FIG. 8. The combination of device-side wedge-shaped portion 68, corresponding tester-side trapezoidal-shaped portion 108, and the 140 interface conductors 54 which pass through openings 86 of that portion 68 and openings 136 of that portion 108 form a unit 68/108/54 which can be removed from interface module 44 separately from each of the other seven such units 68/108/54.

128 of the 140 interface conductors 54 for each unit 68/108/54 are allocated for transmitting digital signals to and from 128 external electrical leads of DUT 40. There are eight units 68/108/54. Consequently, interface module 44 has 1024 conductors 54 allocated for digital-signal transmission. The configuration of module 44 therefore enable the test system of FIG. 3 to handle implementations of DUT 40 having up to 1024 external electrical leads capable of transmitting digital signals.

Eight of the remaining 12 interface conductors 54 for each unit 68/108/54 are allocated for supplying power to DUT 40. The last four of conductors 54 for each unit 68/108/54 are allocated for unspecified purposes. Hence, a total of 64 conductors 54 are allocated for supplying DUT 40 with power while a total of 32 conductors 54 are allocated for unspecified purposes. This allocation is somewhat arbitrary. Some of the 64 conductors 54 allocated to supplying power can be utilized for other purposes, e.g., transmitting digital test signals, if less than 64 conductors 54 are needed for supplying power to DUT 40.

Interface module 44 typically has 32 analog-capability electrical interface conductors (not shown). These 32 analog-capability conductors respectively extend from 32 analog-capability tester-side electrical contacts (not shown) of tester board 42, through 32 of the 37 tester-side analog-capability openings 80 of cylindrical tester-side portion 66, through the 32 device-side analog-capability openings 132 of the eight device-side trapezoidal-shaped portions 106, and to 32 analog-capability device-side electrical contacts (not shown) of device-side board 46. The configuration of interface module 44 thus provides the test system of FIG. 3 with the optional capability to handle implementations of DUT 40 having up to 32 external electrical leads for analog circuitry. The five unused analog-capability openings 80 in tester-side 66 provide some capability for repairing portion 66 and also some flexibility for modifying interface module 44 to add more analog-capability interface conductors if needed.

Along its bottom side, device-side main portion 100 has a central roughly square recession 140 whose lateral periphery is indicated by line 142. See FIG. 6. Cavity 140 provides room for socket-mounting hardware and support componentry. Sealing ring 114 is situated along the outside of all of device-side trapezoidal-shaped portions 108 over the non-recessed part of main portion 100 along its bottom side so as to provide a hermetic seal between device-side board 46 and the region occupied by rectangular-shaped portions 106 and trapezoidal-shaped portions 108. Along its bottom side, main portion 100 also has an outer peripheral recession 144 whose lateral extent is indicated by circle 146. When device chamber 48 is to be operated at a pressure below room pressure, an O ring in chamber 48 meets the non-recessed part of main portion 100 along circle 146 so as to hermetically seal device-side body 52 of module 44 to chamber 48. The configuration of device-side body 52 thus enables a high vacuum to be maintained in chamber 48.

Figure 11:
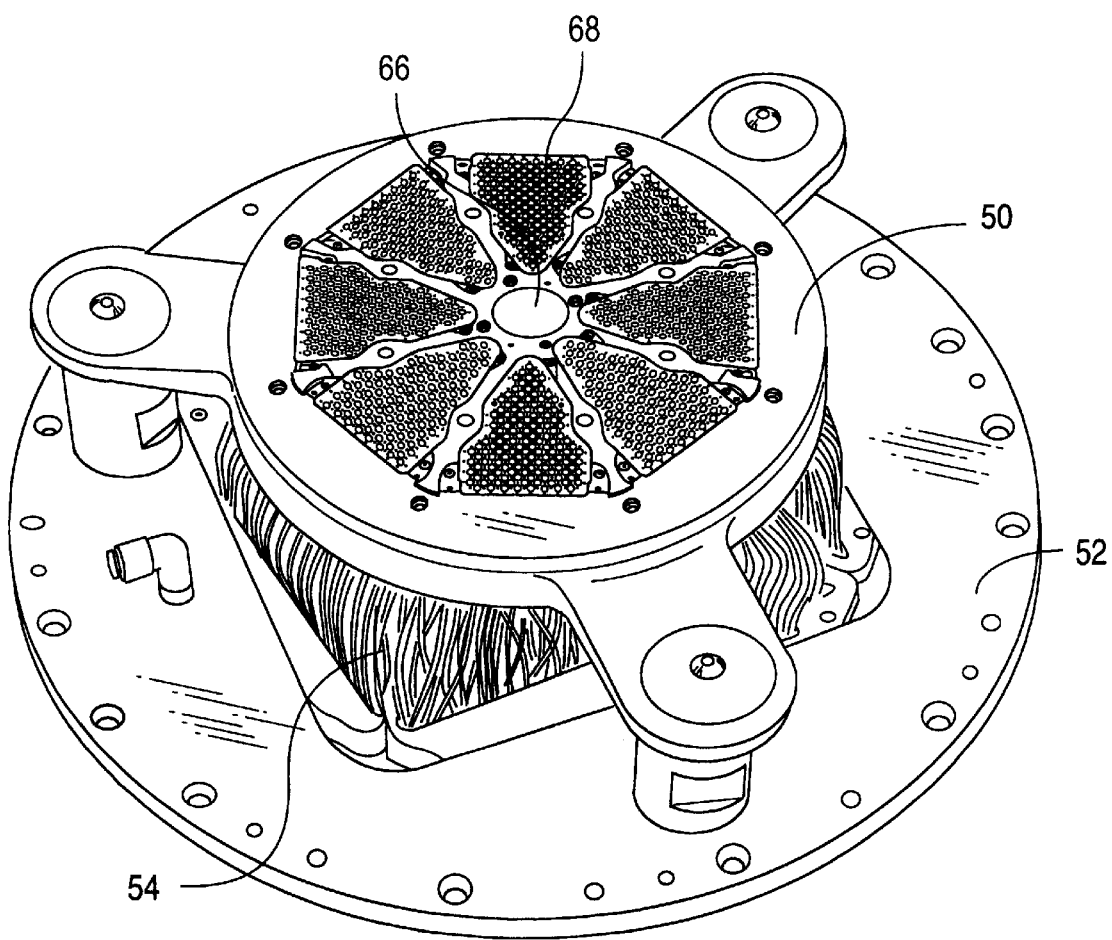
FIGS. 11 and 12 are tester-side and device-side photographs of the interface module of FIG. 4.
Figure 12:
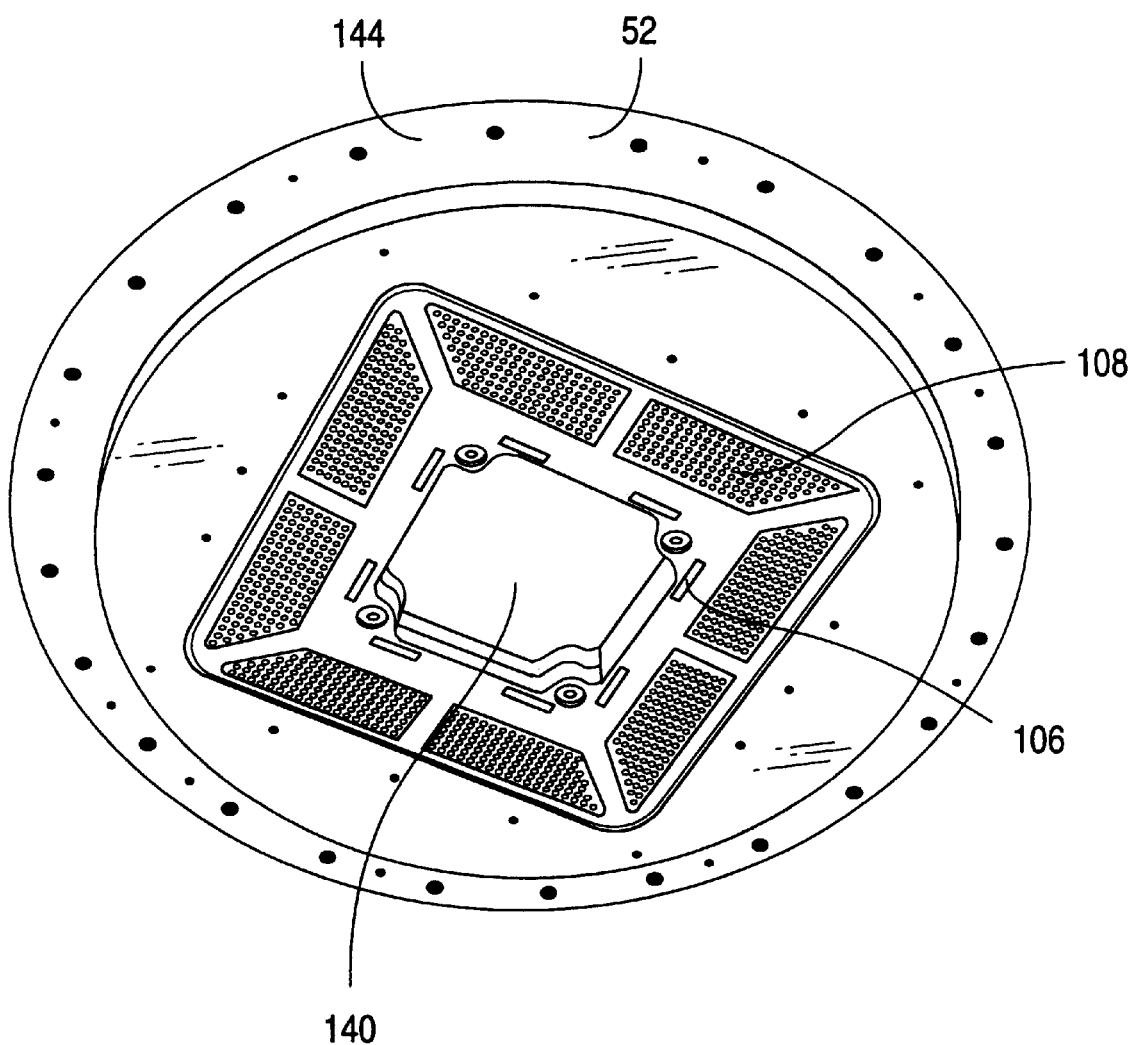

FIGS. 11 and 12 present photographs of interface module 44 as respectively seen from the tester side and the device side. Recessions 140 and 144 can clearly be seen in FIG. 12.

Device chamber 48 may, or may not, be operated at a high vacuum depending on how the non-intrusive probe is implemented. If the non-intrusive probe utilizes electrons or ions to probe DUT 40, chamber 48 is pumped down to a high vacuum, typically $10^{-6}$ torr or lower. The vacuum in chamber 48 then causes device-side body 52 to be held strongly to chamber 48. If the non-intrusive probe probes DUT 40 with light, e.g., in the form of a laser beam, chamber 48 can often be at room pressure. In that case, sealing rings 110, 112, and 114, can be deleted form interface module 44.

Figure 13:
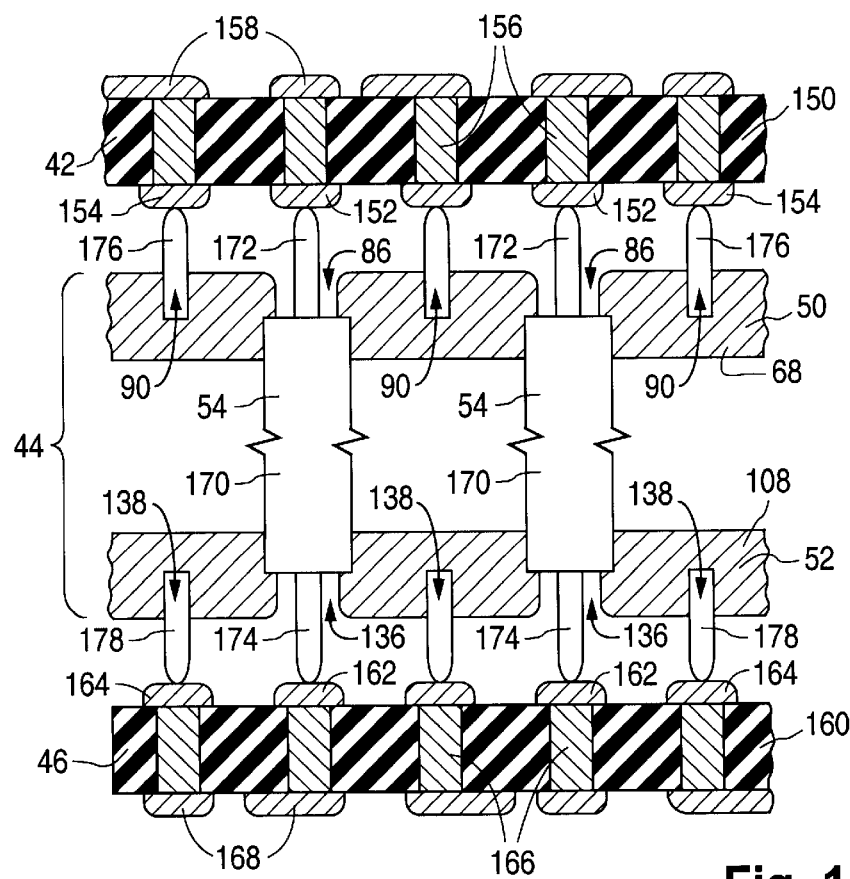
FIG. 13 is a schematic side cross-sectional view of part of the interface module of FIG. 4 as that module is positioned between the tester and device-side boards in the test system of FIG. 3.

FIG. 13 presents a side cross section of part of interface module 44 centered around one unit 68/108/54 for schematically illustrating how digital-capability interface conductors 54 electrically contact tester board 42 and device-side board 46. Boards 42 and 46 are illustrated very simplistically in FIG. 13. Each board 42 and 46 is normally a multi-layer board having electrically conductive traces buried in the board rather than a single-layer board as depicted in FIG. 13. As a result, many of the metal interconnects shown as going fully through board 42 or 46 go only partway through board 42 or 46 when it is a multi-layer board. Each board 42 or 46 also typically has some metal interconnects fully buried in the board. Furthermore, each via may only be partially filled with metal instead of being fully filled with metal as shown in FIG. 13.

Subject to the foregoing comments, simplified tester board 42 in FIG. 13 consists of an electrically insulating main board 150, multiple tester digital-capability electrical contacts 152 situated along the bottom of main board 150, multiple tester digital-ground electrical contacts 154 likewise situated along the bottom of main board 150, multiple metal interconnects 156 situated in vias extending through board 150, and electrically conductive traces 158 situated on top of board 150. Digital-capability contacts 152 and digital-ground contacts 154 are metal pads respectively electrically connected to metal interconnects 156 which, in turn, are connected to conductive traces 158.

Subject to the same comments, simplified device-side board 46 in FIG. 13 consists of an electrically insulating main board 160, multiple device-side digital-capability electrical contacts 162 situated along the top of main board 160, multiple device-side digital-ground electrical contacts 164 also situated along the top of main board 160, multiple metal interconnects 166 situated in vias extending through board 160, and electrically conductive traces 168 situated on the bottom of board 160. Digital-capability contacts 162 and digital-ground contacts 164 are metal pads respectively electrically connected to metal interconnects 166 which, in turn, are connected to conductive traces 168.

Each digital-capability interface conductor 54 consists of an electrical cable 170, a tester-side metal pin 172 electrically connected to one end of cable 170, and a device-side metal pin 174 electrically connected to the other end of cable 170. Cables 170 extend into digital-capability openings 86 of tester-side wedge-shaped portions 68 and into digital-capability openings 136 of device-side trapezoidal-shaped portions 108. Tester-side pins 172 respectively extend out of digital-capability openings 86 to electrically contact tester-side digital-capability contacts 152. Similarly, device-side pins 174 respectively extend out of digital-capability openings 136 to electrically contact device-side digital-capability contacts 162. In addition, tester-side metal pins 176 respectively extend out of digital-ground openings 90 of tester-side wedge-shape portions 68 to electrically contact digital-ground contacts 154. Device-side metal pins 178 similarly respectively extend out of digital-ground openings 138 of device-side trapezoidal-shaped portions 108 to electrically contact device-side digital-ground contacts 164.

Figure 14:
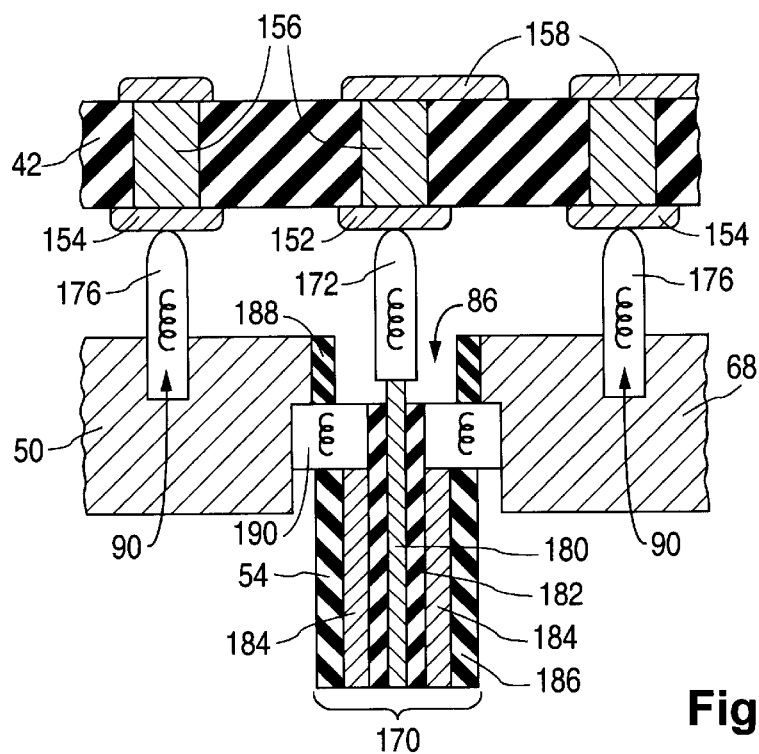
FIG. 14 is a schematic side cross-sectional view of part of one interface conductor as it passes through the interface module of FIG. 4.

FIG. 14 presents a more detailed schematic cross section of how one digital-capability interface conductor 54 is typically generally implemented to pass through a digital-capability opening 86 of one tester-side wedge-shaped portion 68 and electrically contact a digital-capability tester contact 152 of tester board 42 illustrated here in the simplistic form utilized in FIG. 13. In this general implementation, cable 170 of illustrated interface conductor 54 is a coaxial cable formed with an inner metal signal conductor 180, intermediate annular electrical insulation 182 situated over signal conductor 180, an outer annular metal ground conductor 184 situated over insulation 182, and outer electrical insulation 186 situated over ground conductor 184. Tester-side digital-capability metal pin 172, which electrically contacts illustrated tester contact 152, is a spring-loaded contact that also electrically contacts signal conductor 180. Item 188 in FIG. 14 indicates further electrical insulation which prevents tester-side pin 172 from being electrically connected to metal wedge-shaped portion 68.

Cable 170 in the implementation of FIG. 14 also includes a spring-loaded contact 190 which electrically connects ground conductor 184 to illustrated metal wedge-shaped portion 68. Tester-side digital-ground pin 176 is a spring-loaded contact in the implementation of FIG. 14. Ground conductor 184 carries a digital ground reference potential. By employing the arrangement of FIG. 14, the digital ground potential on ground conductor 184 is transferred through spring-loaded contact 190, wedge-shaped portion 68, and spring-loaded pin 176 to a digital-ground contact 154 on tester board 42. An arrangement largely identical to that of FIG. 14 is typically utilized on the other end of interface conductor 54 for electrically connecting signal conductor 180 and ground conductor 184 respectively to a digital-capability device-side contact 162 and a digital-ground device-side contact 164.

The analog-capability interface conductors extend through analog-capability openings 80 in cylindrical tester-side portion 66 and through analog-capability openings 132 in the eight rectangular-shaped device-side portions 106 to respectively electrically connect the analog-capability tester electrical contacts on tester board 42 to the analog-capability device-side electrical contacts on device-side board 46 in the same way as shown in FIG. 14. The analog-capability contacts, along with the associated analog-ground electrical contacts, are thus normally metal pads. An arrangement largely identical to that of FIG. 14 is also employed for connecting the ends of the analog-capability interface conductors to the analog-capability tester and device-side contacts.

Analog ground potential normally needs to be a "quiet" ground. Digital ground potential may vary significantly compared to analog ground potential. When interface module 44 is configured in the manner described above in conjunction with FIGS. 4–10 and ground connections are provided in the way just described, analog ground potential is largely isolated from digital ground potential. Hence, analog ground potential in module 74 can be a quiet ground even if digital ground potential is noisy.

Device-side body 52 in interface module 44 is physically coupled to tester-side body 50 only by digital-capability interface conductors 54 and the analog-capability interface conductors. These conductors are physically moderately flexible. As indicated above, device-side protective posts 102 cooperate with tester-side flanges 62 to prevent module 44 from being significantly distended during handling but do not touch flanges 62 during normal test operation. As a result, the configuration of module 44 substantially inhibits any vibrations that may arise in test components 12, 14, and 16 from being transmitted to device chamber 48 and disturbing the function of the non-intrusive probe in chamber 48.

While the invention has beet described with reference to particular embodiments, this description is solely for the purpose of illustration and is not to be construed as limiting the scope of the invention claimed below. For instance, the number of tester-side wedge-shaped portions 68 can be different from eight. In one aspect, the number of wedge-shaped portions 68 is generally a multiple of 4, such as 8, 12, 16, and so on, where 8 is the lowest multiple of 4. Each side of the generally annular square pattern formed by device-side digital-capability portions 108 is then normally associated with a plural number, e.g., 2, 3, 4, and so on, of tester-side wedge-shaped portions 68. Choosing the number of portions 68 in this manner facilitates repairing module 44 and enables the test system of FIG. 3 to test implementations of DUT 40 having an increased number of external electrical leads.

The repairability and increased lead-count advantages can also be achieved when there are as few as five tester-side wedge-shaped portions 68, provided that the outer lateral periphery of wedge-shaped portions 68 are, as a group, roughly shaped like a regular polygon having at least five sides so that digital-capability openings 86 in portions 68 form a pattern whose outer lateral periphery is likewise roughly a regular polygon having at least five sides. The base of each portion 68 then forms one side of the polygon.

As briefly indicated above, the base of each tester-side wedge-shaped portion 69 can be significantly curved, e.g., circularly curved so that each wedge-shaped portion is roughly shaped like a piece of pie. In that case, the outer lateral periphery of portions 68 is, as a group, shaped generally like a circle. For the situation in which tester-side digital-capability openings 86 largely fully occupy portions 68, the outer lateral periphery of the pattern formed by openings 86 is then likewise roughly a circle.

When the pattern of tester-side digital-capability openings 86 has roughly a circular outer lateral periphery, the number of tester-side wedge-shaped portions 86 can be reduced to four, or even three, each portion 68 still being generally shaped like wedge. Four wedge-shaped portions 68 provide an attractive variation because four portions matches the number of sides in the generally square shaped typically formed by device-side digital-capability portions 108. Nonetheless, the number of portions 68 can even be reduced to two in certain cases. When there are two portions 68, each portion 68 is generally shaped like a half moon rather than a wedge.

As the number of tester-side digital-capability portions 68 changes, the number of device-side digital-capability portions 108 typically changes in the same way. Device-side portions 108 can also be arranged so that the pattern formed by their outer lateral periphery significantly differs from a square. For instance, the outer lateral periphery of device-side portions 109 can, as a group, be shaped generally like a rectangle whose sides are not all of largely the same length.

It may, in some cases, be advantageous for the base of each device-side digital-capability portion 108 to be significantly curved, e.g., circularly curved. Digital-capability portions 108 may, as a group, then have a generally circular outer lateral periphery. When device-side digital-capability openings 136 largely fully occupy digital-capability portions 108, openings 136 then form a pattern whose outer lateral periphery largely matches the pattern of the outer lateral periphery, e.g., rectangular or even circular, of device-side digital-capability portions 108.

Additional analog test capability can be built into interface module 40 by modifying bodies 50 and 52 to increase the size of cylindrical tester-side analog capability portion 66 and rectangular-shaped device-side analog-capability portions 106. This may, or may not, involve decreasing the size of wedge-shaped tester-side digital-capability portions 68 and trapezoidal-shaped device-side digital-capability portions 108.

The designation of the interface conductors that go through-openings 80 in cylindrical tester-side portions 66 and through openings 132 in rectangular-shaped device-side portion 106 as analog-capability conductors is arbitrary. If DUT 40 is solely digital and has more than 1024 external electrical leads for transmitting digital signals, the interface conductors which go through openings 80 and 132 can be utilized for transmitting digital test signals to the extent that the additional necessary digital test capability is not achieved with the 96 conductors 54 allocated for supplying power and for unspecified purposes.

The designation of interface conductors 54 as digital-capability conductors is likewise arbitrary. If DUT 40 is solely analog and has more than 32 external leads for transmitting analog test signals, conductors 54 can be employed for transmitting analog test signals. If DUT 40 is largely analog and has no more than 32 external electrical leads for transmitting digital test signals, the digital/analog roles of conductors 54 and the other 32 interface conductors can be reversed. Various modifications and applications may thus be made by those skilled in the art without departing from the true scope and spirit of the invention as defined in the appended claims.

We claim:

1. An interface module for situation between (a) a tester mechanism having multiple electrical tester contacts for carrying electrical test signals and (b) a device-side board having multiple electrical device-side contacts for connection to external electrical leads of an electronic device under test, the module comprising:

a tester-side body comprising at least five physically separate generally wedge-shaped tester-side portions laterally arranged so that their tips are directed generally toward one another, each tester-side portion having multiple tester-side openings suitable for being positioned respectively opposite corresponding ones of the tester contacts;

a device-side body having multiple device-side openings suitable for being positioned respectively opposite the device-side contacts; and multiple electrical interface conductors, each extending through one of the tester-side openings and through a corresponding one of the device-side openings for electrically connecting one of the tester contacts to a corresponding one of the device-side contacts.

2. A module as in claim 1 wherein the tester-side openings are arranged in a pattern whose outer periphery is shaped generally like a circle or like a polygon having at least five sides respectively corresponding to the tester-side portions, multiple ones of the tester-side openings in each tester-side portion defining the corresponding side of the polygon.

3. A module as in claim 2 wherein the polygon is approximately a regular polygon.

4. A module as in claim 1 wherein the number of tester-side portions is a multiple of four.

5. A module as in claim 2 wherein the tester-side openings in each tester-side portion are arranged in lines extending generally parallel to each other and generally toward the center of the circle or polygon, the tester-side openings in at least one pair of consecutive ones of the lines in each tester-side portion being staggered relative to one another.

6. A module as in claim 1 wherein the device-side body comprises at least five physically separate device-side portions respectively corresponding to the tester-side portions, each device-side portion having multiple ones of the device-side openings such that one of the interface conductors passes through one of the device-side openings of that device-side portion and then through one of the tester-side openings of the corresponding tester-side portion.

7. A module as in claim 6 wherein each tester-side portion, the corresponding device-side portion, and the interface conductors passing through their tester-side and device-side openings form a unit which is removable from the module separately from each other such unit.

8. A module as in claim 6 wherein the device-side openings are arranged in a pattern whose outer periphery is shaped generally like a rectangle.

9. A module as in claim 8 wherein the rectangular pattern of the outer periphery of the device-side openings is generally square.

10. A module as in claim 6 wherein the number of tester-side portions is a multiple of four, and the number of device-side portions is also a multiple of four.

11. A module as in claim 1 wherein the tester-side portions are largely identical to one another.

12. A module as in claim 1 wherein the device-side body is physically coupled to the tester-side body substantially only through electrical interface conductors which extend through openings in both the tester-side body and the device-side body.

13. A module as in claim 1 wherein (a) the tester mechanism has multiple further electrical tester contacts for carrying further electrical test signals and (b) the device-side board has multiple further device-side electrical contacts for connection to further electrical leads of the device under test and wherein:

the tester-side body has multiple further tester-side openings suitable for being positioned respectively opposite the further tester contacts;

the device-side body has multiple further device-side openings suitable for being positioned respectively opposite the further device-side contact;

the module further includes multiple further electrical interface conductors, each extending through one of the further tester-side openings and through a corresponding one of the further device-side openings for electrically connecting one of the further tester contacts to a corresponding one of the further device-side contacts.

14. A module as in claim 13 wherein;

the further interface conductors are utilized in providing an analog test capability; and the other interface conductors are utilized in providing a digital test capability.

15. A module as in claim 13 wherein the device-side body is physically coupled to the tester-side body substantially only through the interface conductors.

16. A module as in claim 1 wherein the device under test is an integrated circuit.

17. An interface module for situation between (a) a tester mechanism having multiple electrical tester contacts for carrying electrical test signals and (b) a device-side board having multiple electrical device-side contacts for connection to external electrical leads of an electronic device under test, the module comprising:

a tester-side body having multiple tester-side openings suitable for being positioned respectively opposite the tester contacts, the tester-side openings being laterally arranged (a) in a pattern whose outer periphery is shaped generally like a circle or like a polygon having at least five sides and (b) in lines directed generally toward the center of the circle or polygon, the tester-side openings in at least one pair of consecutive ones of the lines being staggered relative to one another;

a device-side body having multiple device-side openings suitable for being positioned respectively opposite the device-side contacts; and multiple electrical interface conductors, each extending through one of the tester-side openings and through a corresponding one of the device-side openings for electrically connecting one of the tester contacts to a corresponding one of the device-side contacts.

18. A module as in claim 17 wherein, when the outer periphery of the pattern of the tester-side openings is specifically shaped generally like a polygon, the tester-side body comprises at least five tester-side portions, each having multiple ones of the tester-side openings, multiple ones of the tester-side openings in each tester-side portion defining a different corresponding one of the sides of the polygon, the lines of the tester-side openings in each tester-side portion extending generally parallel to one another.

19. An interface module for situation between (a) a tester mechanism having multiple electrical tester contacts for carrying electrical test signals and (b) a device-side board having multiple electrical device-side contacts for connection to external electrical leads of an electronic device under test, the interface module comprising:

a tester-side body having multiple tester-side openings suitable for being positioned respectively opposite the tester contacts, the tester-side openings being arranged in a pattern whose outer periphery is shaped generally like a circle or like a polygon having at least five sides;

a device-side body having multiple device-side openings suitable for being positioned respectively opposite the device-side contacts, the device-side openings being arranged generally in a pattern whose outer periphery is shaped generally like a rectangle; and multiple electrical interface conductors, each extending through one of the tester-side openings and through a corresponding one of the device-side openings for electrically connecting one of the tester contacts to a corresponding one of the device-side contacts.

20. A module as in claim 19 wherein the number of sides of the polygon is a multiple of four.

21. An interface module for situation between (a) a tester mechanism having multiple electrical tester contacts for carrying electrical test signals and (b) a device-side board having multiple electrical device-side contacts for connection to external electrical leads of an electronic device under test, the module comprising:

a tester-side body comprising at least two physically separate tester-side portions laterally arranged so that their outer lateral peripheries are, as a group, generally shaped like a circle, each tester-side portion having multiple tester-side openings suitable for being positioned respectively opposite corresponding ones of the tester contacts;

a device-side body having multiple device-side openings suitable for being positioned respectively opposite the device-side contacts; and multiple electrical interface conductors, each extending through one of the tester-side openings and through a corresponding one of the device-side openings for electrically connecting one of the tester contacts to a corresponding one of the device-side contacts.

22. A module as in claim 21 wherein the device-side body comprises at least two physically separate device-side portions respectively corresponding to the tester-side portions, each device-side portion having multiple ones of the device-side openings such that one of the interface conductors passes through one of the device-side openings of that device-side portion and then through one of the tester-side openings of the corresponding tester-side portion.

23. A module as in claim 22 wherein each tester-side portion, the corresponding device-side portion, and the interface conductors passing through their tester-side and device-side openings form a unit which is removable from the module separately from each other such unit.

24. A module as in claim 21 wherein the number of tester-side portions is at least four, whereby the tester-side portions are generally wedge shaped.

* * * * *